（12）United States Patent
Ma et al.

(10) Patent No.: US 7,472,322 B1
(45) Date of Patent: Dec. 30, 2008

(54) ON-CHIP INTERFACE TRAP CHARACTERIZATION AND MONITORING

(75) Inventors: Zhijian Ma, Cupertino, CA (US); Chunbo Liu, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 592 days.

(21) Appl. No.: 11/141,223

(22) Filed: May 31, 2005

(51) Int. Cl.
*G01R 31/317* (2006.01)
*G01R 31/40* (2006.01)
(52) U.S. Cl. ................ 714/724; 714/735; 438/234
(58) Field of Classification Search .............. None
See application file for complete search history.

(56) References Cited

U.S. PATENT DOCUMENTS

| 3,596,172 | A | * | 7/1971 | Harrison ............... 323/263 |
| 3,914,623 | A | * | 10/1975 | Clancy ................ 327/134 |
| 3,995,216 | A | | 11/1976 | Yun | |
| 4,163,937 | A | * | 8/1979 | Laass ................. 324/605 |
| 5,286,656 | A | * | 2/1994 | Keown et al. .......... 438/18 |
| 5,514,628 | A | | 5/1996 | Enomoto et al. | |
| 6,028,324 | A | | 2/2000 | Su et al. | |
| 6,037,797 | A | | 3/2000 | Lagowski et al. | |
| 6,127,694 | A | * | 10/2000 | Nakajima ............. 257/48 |
| 6,391,668 | B1 | | 5/2002 | Chacon et al. | |
| 6,714,031 | B2 | * | 3/2004 | Seki .................. 324/763 |
| 6,815,971 | B2 | | 11/2004 | Wang et al. | |
| 6,838,869 | B1 | | 1/2005 | Rogers et al. | |
| 7,132,878 | B2 | * | 11/2006 | Chen et al. ........... 327/536 |
| 2003/0006413 | A1 | * | 1/2003 | Chawla et al. ......... 257/48 |
| 2003/0011949 | A1 | * | 1/2003 | Ker et al. ............. 361/56 |
| 2004/0085084 | A1 | | 5/2004 | Wang et al. | |

\* cited by examiner

*Primary Examiner*—John P Trimmings
*Assistant Examiner*—Dipakkumar Gandhi
(74) *Attorney, Agent, or Firm*—Kenneth Glass; Glass & Associates

(57) ABSTRACT

A method and apparatus for testing semiconductor wafers is disclosed in which a test circuit is used that includes a waveform generator. The test circuit can test a single transistor or can test multiple transistors. A testing method is disclosed in which a supply voltage is applied to the waveform generator to produce pulses that are applied to the gate of a transistor to be tested. A bias voltage is applied to the source and drain of the transistor to be tested, and the charge pumping current that is generated at the substrate is then measured. The process can be repeated at different bias voltage levels to obtain additional current measurements, indicating the maximum charge pumping current for the transistor that is being tested. The determined maximum charge pumping current can then be used for determining whether there is excessive 1/f noise in the device under test.

16 Claims, 8 Drawing Sheets

ON-CHIP INTERFACE TRAP CHARACTERIZATION AND MONITORING

FIELD OF THE INVENTION

The present invention relates to the field of semiconductor devices. More specifically, the present invention relates to semiconductor device testing circuitry and methods for testing semiconductor devices.

BACKGROUND ART

1/f noise is important in mixed signal and analog application because it presents a lower limit of the signal level that can be processed. It is believed that 1/f noise in integrated circuit devices is caused by charge trapping and de-trapping at the traps near the oxide and silicon interface. One conventional process for characterizing the density of interface traps includes connecting a stand-alone waveform generator to the semiconductor substrate and connecting a testing device to the waveform generator. Typically, the testing device is a computer that connects to the waveform generator using an electrical cable that connects to a serial port or a USB port on the waveform generator. However, the waveform generator is expensive and time consuming to set up.

Though conventional in-line testing methods are sufficient for testing the characteristics of semiconductor devices with just a few different types of transistors, processing technologies are moving to processes that use many different transistor types in the same product. For example, a single die can include NMOS and PMOS transistors, low and high threshold voltage transistors, transistors having different thicknesses of gate oxide, buried channel transistors, surface channel transistors, different doping concentrations, different N-well and P-well characteristics, etc.

Accordingly, there is a need for a method and apparatus that will allow for testing semiconductor die that include multiple different types of transistors. In addition, there is a need for a method and apparatus that will meet the above need and that does not require the use of a stand-alone waveform generator.

DISCLOSURE OF THE INVENTION

The present invention provides a method and apparatus for testing semiconductor wafers using a test circuit that includes a waveform generator. In one embodiment, each test circuit includes a waveform generator and a single device under test. In another embodiment multiple devices under test are connected to a common set of contact pads, allowing for testing of multiple different devices on the semiconductor wafer using a limited number of contact pads.

A testing method is disclosed in which a supply voltage is applied to a waveform generator. The waveform generator then produces pulses that are applied to a gate of a transistor to be tested. A bias voltage is applied to the source and drain of the transistor to be tested, where the source and the drain of the transistor to be tested are electrically coupled together. The current ($I_{CP}$) that is generated at the body of the semiconductor wafer is then measured, and the process is repeated at different bias voltage levels to obtain additional current measurements, indicating the maximum charge pumping current $I_{CP, max}$ for the transistor that is being tested. The determined maximum charge pumping current can then used to calculate the density of interface traps (Nit) for the device under test or can be used independently for determining whether there is excessive 1/f noise in the device under test. When the test indicates that there is excessive 1/f noise, the production processes can be altered to try to improve the interface characteristics so as to reduce the indicated 1/f noise.

Accordingly, the method and apparatus of the present invention facilitates in-line automatic measurement of interface state density, allowing for quick and accurate determination of interface state density. Moreover, because the test circuits of the present invention include a waveform generator, there is no need to connect the test circuitry to a stand-alone waveform generator as is required in prior art testing methods, saving setup time and the cost of purchasing a stand-alone waveform generator. These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
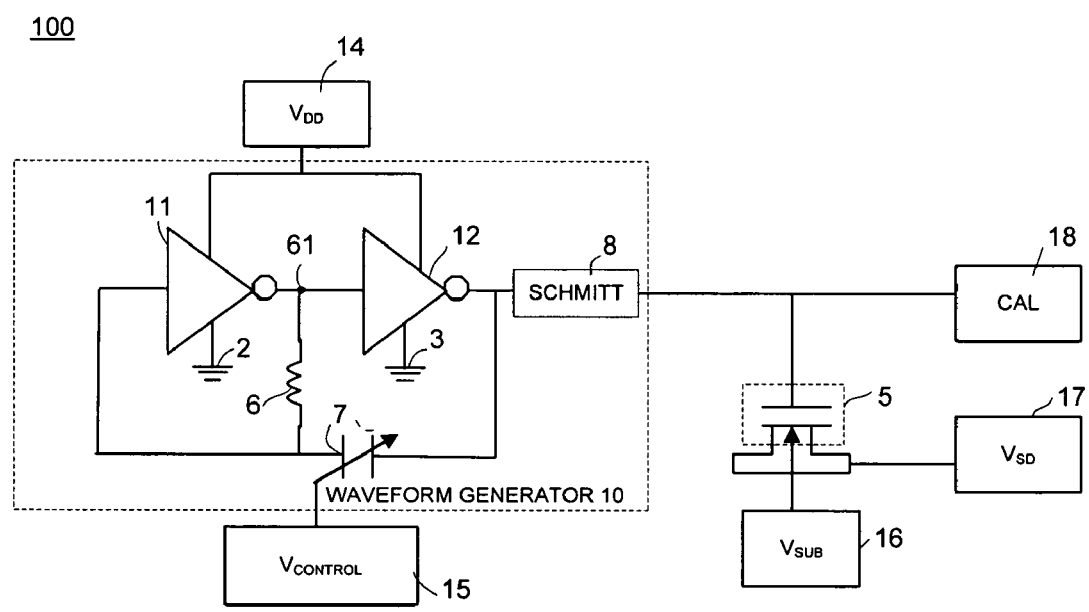
FIG. 1 is a diagram that illustrates a test circuit that includes a waveform generator and a transistor to be tested in accordance with one embodiment of the present invention.

FIG. 1 shows a test circuit 100 that includes a device to be tested (device under test) 5 and a waveform generator 10 that are formed on the semiconductor wafer to be tested. The waveform generator 10 is electrically connected to the device under test 5. Test circuit 100 also includes contact pads 14-18 that provide for coupling input and output to waveform generator 10 and device under test 5. In the present embodiment contact pad 14 provides supply voltage ($V_{DD}$) to waveform generator 10 and contact pad 15 provides a control voltage ($V_{CONTROL}$) to waveform generator 10.

Waveform generator 10 includes inverters 11-12, a resistor 6 and a capacitor 7 that are coupled together so as to form a multivibrator type oscillator that is connected to a Schmitt trigger 8. More particularly, inverter 11 is electrically connected to supply voltage contact pad 14 and to ground 2. The output of inverter 11 is electrically connected to the input of inverter 12. Inverter 12 is electrically connected to supply voltage contact pad 14 and to ground 3. The output of inverter 12 is electrically connected to Schmitt trigger 8. Control voltage contact pad 15 is electrically connected to one terminal of capacitor 7. The other terminal of capacitor 7 is connected to the output of inverter 12 between the output of inverter 12 and the input of Schmitt trigger 8. One end of resistor 6 is electrically connected to the output of inverter 11 between the output of inverter 11 and the input of inverter 12. The other end of resistor 6 electrically connects to the input of inverter 11 and to capacitor 7.

In the present embodiment capacitor 7 is a variactor having a voltage that is controlled by input received over control voltage contact pad 15. In the present embodiment the frequency of waveform generator 10 is set by adjusting the voltage applied to $V_{CONTROL}$ contact pad 15. The output of Schmitt trigger 8 is electrically connected to device under test 5 and to calibration contact pad 18. Contact pads 16-17 electrically couple to device under test 5 for coupling input to, and receiving output from, device under test 5.

In the present embodiment device under test 5 is a NMOS transistor that includes a gate that is electrically coupled to Schmitt trigger 8. The source and drain of the NMOS transistor are electrically connected together and electrically connected to $V_{SD}$ contact pad 17. The body of device under test 5 is electrically connected to $V_{SUB}$ contact pad 16. In the present embodiment $V_{SUB}$ contact pad 16 is an NMOS transistor that is electrically coupled to the substrate near device under test 5. This can be a contact that connects to the N or P well within which device under test 5 is formed.

Still referring to FIG. 1, test circuit 100 is formed on a single semiconductor wafer that is to be tested. Test circuit 100 can be either formed in a scribe line or in a test die on the semiconductor wafer to be tested, with contact pads 14-18 exposed so as to allow for testing of the semiconductor wafer.

In the present embodiment test circuit 100 is formed using some or all of the process steps that are used to form surrounding die with device under test 5 being a type of device that is also formed in surrounding die. In the embodiment shown in FIG. 1, the NMOS transistor that is the device under test 5 is identical to a NMOS transistor in the die and is formed at the same time as the corresponding NMOS transistor in the die. This produces a test circuit that includes a device under test that has the same electrical and physical properties of the device of interest in the production die.

Figure 2:
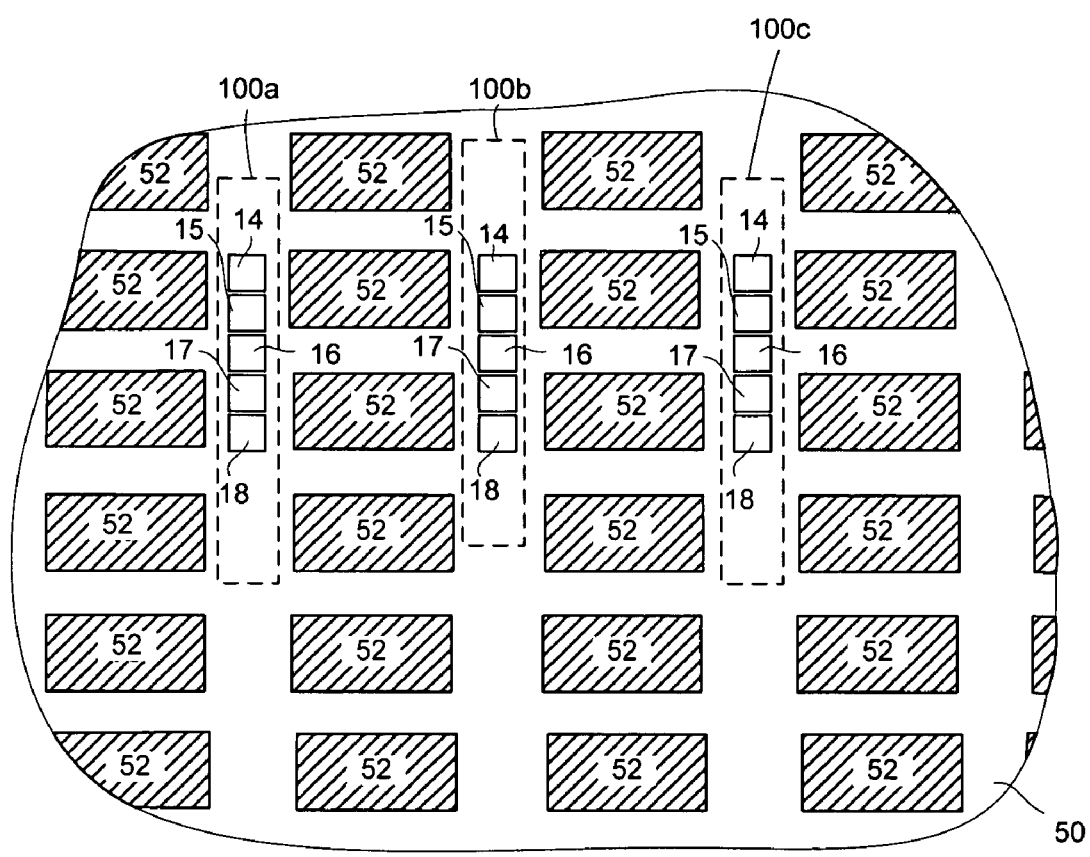
FIG. 2 is a diagram that illustrates a top view of a portion of a semiconductor substrate on which die regions have been formed and on which the test circuit of FIG. 1 has been formed in accordance with one embodiment of the present invention.

FIG. 2 shows an embodiment in which test circuits 100a-c are formed in scribe lines of an exemplary semiconductor wafer 50. More particularly, test circuits 100a-c are formed in the space between die 52. Alternatively, test circuits 100 a-c could be formed in one or more test die (not shown) on semiconductor wafer 50. In the present embodiment each of test circuits 100a-c tests a different device under test 5. In one embodiment test circuit 100a tests a first type of NMOS transistor, test circuit 100b tests a different type of NMOS transistor, and test circuit 100c tests a PMOS transistor. The different types of transistors that are tested by test circuits 100a-c can differ by having, for example, different N-well or P-well doping concentrations, different source/drain characteristics, different gate oxide thickness, different size, different threshold voltage levels, buried channels, surface channels, etc. In the present embodiment, each device under test 5 that is tested by test circuits 100a-c is a type of device that is also formed in a die 52. Accordingly, each of test circuits 100a-c will allow for measurement of $Si/SiO_2$ interface state density of a different device in die 52.

In the present embodiment the test begins by coupling external circuitry to contact pads 14-18. The external circuitry can be connected using probe pads that include pins that contact each of contact pads 14-18 of a test circuit 100a-c that is to be tested. Supply voltage is applied through $V_{DD}$ contact pad 14 and ground is applied through grounding the bottom of the wafer or through one or more ground contact pads (not shown). Voltage is applied to $V_{CONTROL}$ contact pad 15 and the output of waveform generator 10 is monitored through calibration contact pad 18. In the present embodiment an oscilloscope or other monitoring device (e.g., a computer having a test program) is connected to calibration contact pad 18 for monitoring the output of waveform generator 10.

Figure 3:
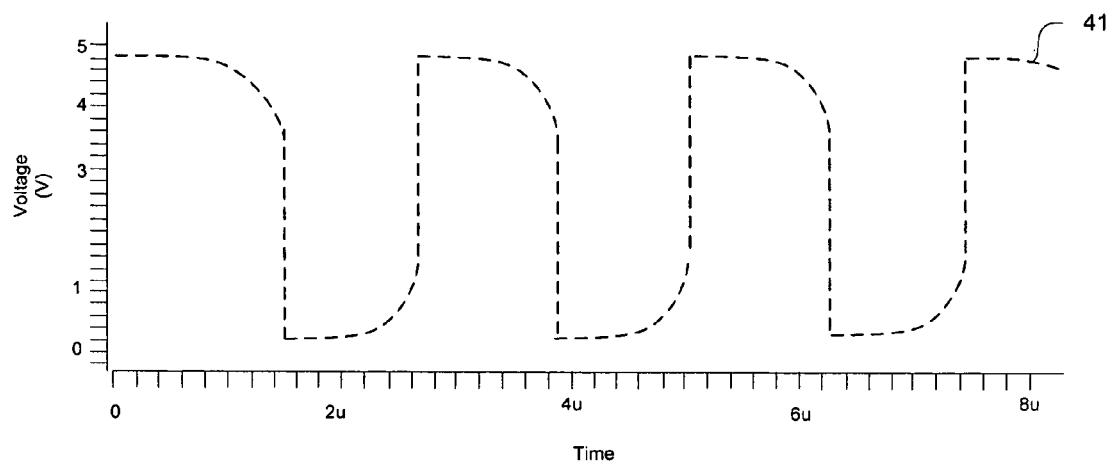
FIG. 3 is a diagram of voltage (Volts) versus time at node 61 shown in FIG. 1 in accordance with one embodiment of the present invention.
Figure 4:
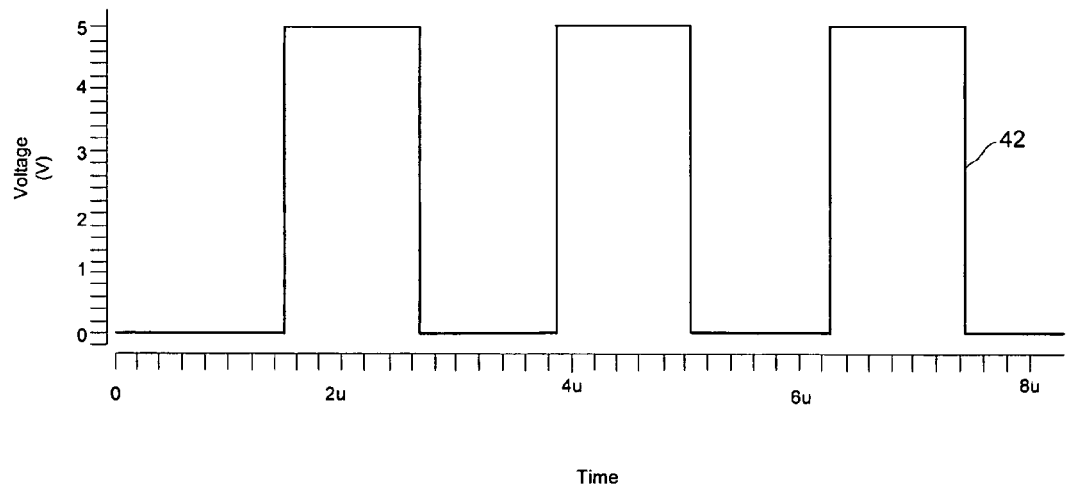
FIG. 4 is a diagram of voltage (Volts) versus time that illustrates an exemplary waveform that is generated by the waveform generator in accordance with one embodiment of the present invention.
Figure 5:
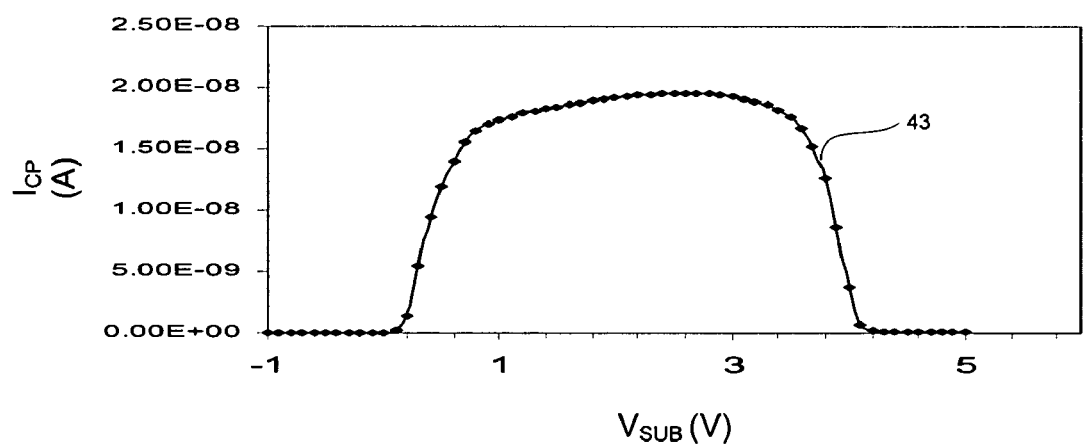
FIG. 5 is a diagram of charge pumping current ($I_{CP}$) in Amperes versus bias voltage ($V_{SUB}$) in Volts for an exemplary transistor that is being tested in accordance with one embodiment of the present invention.

A calibration process is then performed by adjusting the voltage applied to $V_{CONTROL}$ contact pad 15 until the desired waveform frequency is obtained. Referring now to FIG. 3, an exemplary waveform 41 is shown that is generated at node 61. Waveform 41 is shaped by Schmitt trigger 8 so as to obtain waveform 42 shown in FIG. 4. Waveform 42 includes pulses having a voltage amplitude of +5 volt. The output of Schmitt trigger 8 is applied to the gate of the device under test 5. More particularly, in the present embodiment, waveform 42 is applied to the gate of the transistor to be tested (device under test 5). A voltage $V_{SD}$ is applied to $V_{SD}$ contact pad 17 so as to apply a bias voltage to the source/drain of device under test 5. Waveform generator 10 pulses the substrate between inversion and accumulation and the resulting charge pumping current ($I_{CP}$) caused by the repetitive recombination at the interface traps is measured at $V_{SUB}$ contact pad 16. This process is repeated at different substrate bias levels to obtain additional measurements. The maximum charge pumping current $I_{CP}$ obtained by varying the substrate bias, referred to as maximum charge pumping current $I_{CP, max}$ is then determined. FIG. 5 shows an exemplary graph in which the charge pumping current $I_{CP}$ is indicated on the vertical axis and substrate bias is indicated on the horizontal axis to obtain a curve 43 for an exemplary device under test 5. In the present example, the maximum charge pumping current obtained by varying the substrate bias is approximately $2.0 \times 10^{-8}$ Amperes.

The determined maximum charge pumping current is then used to determine interface state density. In the present embodiment interface state density is determined by calculating the interface state density (Nit) using the following equation:

$$I_{cp,max} = freq \times Area \times q \times Nit$$

where freq is the frequency of the pulse applied to the gate; Area the area of the transistor gate; and q the electron charge. It is appreciated that other equations and other methods, well known in the art, could also be used for determining interface state density using charge pumping current ($I_{CP}$) and/or maximum charge pumping current $I_{CP, max}$ measurements. The present invention is intended to cover all such alternative embodiments.

A high $I_{CP, max}$ gives a high Nit, indicating excessive 1/f noise in the device under test 5. Fabrication processes can then be altered to try to reduce the indicated 1/f noise. Testing is then performed on semiconductor wafers from the revised fabrication process. This procedure is repeated to obtain die 52 having acceptable 1/f noise characteristics.

Figure 6:
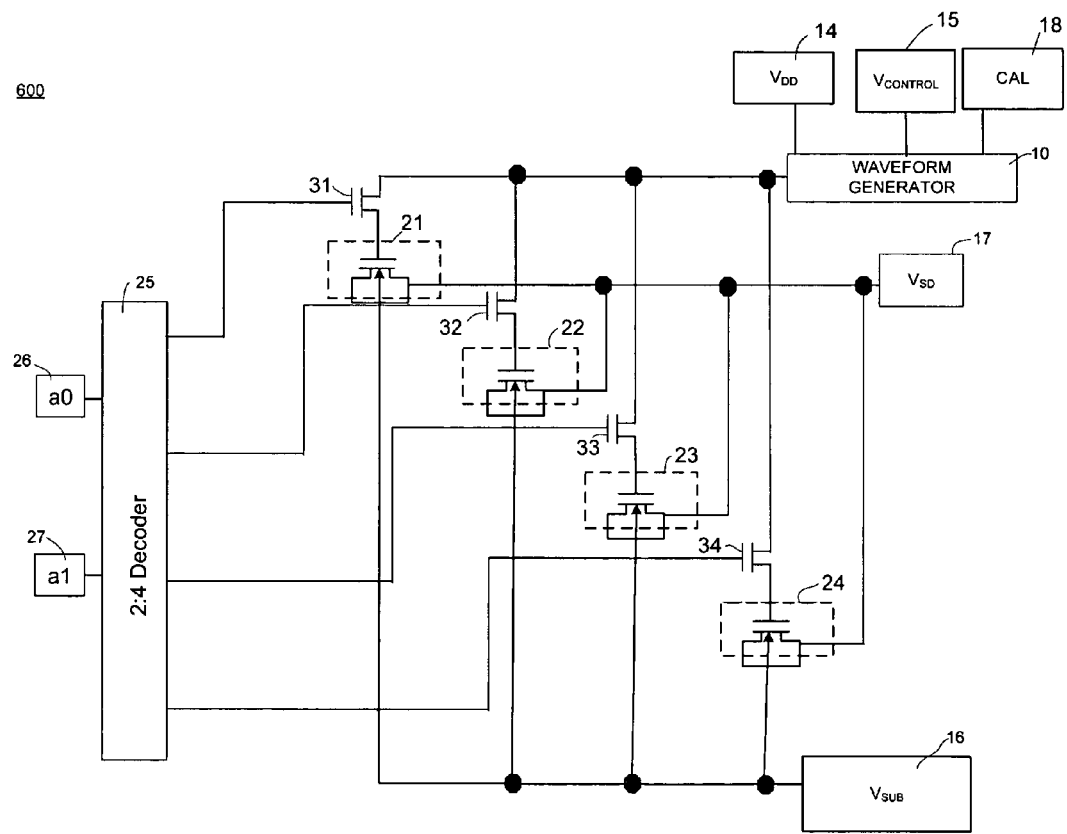
FIG. 6 is a diagram of a testing circuit that includes a waveform generator, a decoder and four transistors to be tested in accordance with one embodiment of the present invention.

FIG. 6 shows a test circuit 600 that includes four different transistors 21-24 that are to be tested. Test circuit 600 includes a waveform generator 10 that is electrically connected to contact pads 14-15 and 18. A switching circuit extends between each device under test 21-24 and the output of waveform generator 10 such that each device under test 21-24 can be individually selected for testing. In the present embodiment, the switching circuit includes NMOS transistors 31-34, decoder 25 and contact pads 26-27. The gate of each of NMOS transistor 31-34 is electrically connected to decoder 25. Decoder 25 is electrically connected to contact pads 26-27 for controlling the operation of NMOS transistors 31-34.

Continuing with FIG. 6, the source of NMOS transistor 31 is electrically connected to the output of waveform generator 10, and the drain of NMOS transistor 31 is electrically connected to the gate of device under test 21. The source of NMOS transistor 32 is electrically connected to the output of waveform generator 10, and the drain of NMOS transistor 32 is electrically connected to the gate of device under test 22. The source of NMOS transistor 33 is electrically connected to the output of waveform generator 10, and the drain of NMOS transistor 33 is electrically connected to the gate of device under test 23. Similarly, the source of NMOS transistor 34 is electrically connected to the output of waveform generator 10, and the drain of NMOS transistor 34 is electrically connected to the gate of device under test 24. The source and drain of each device under test 21-24 are electrically connected together and are electrically connected to $V_{SD}$ contact pad 17. The substrate of each device under test 21-24 is electrically connected to $V_{SUB}$ contact pad 16. In the present embodiment $V_{SUB}$ contact pad 16 is electrically coupled to the substrate near each device under test 21-24 (e.g., a contact that connects to the P well within which device under test 21-24 is formed).

Though each device under test 21-24 is shown as being an NMOS transistor, devices under test 21-24 can also be PMOS transistors. Though test circuit 600 is shown to include four devices under test 21-24, it is appreciated that test circuit 600 can include more or fewer devices under test. Accordingly, test circuit 600 allows for testing all of the different types of devices on each die 52 that are likely to produce different 1/f noise characteristics.

In the present embodiment testing using circuit 600 begins by coupling external circuitry to contact pads 14-18 and 26-27. In the present embodiment probe pads are used that include pins that contact each of contact pads 14-18 and 26-27. Supply voltage is applied through $V_{DD}$ contact pad 14, and ground is applied through grounding the bottom of the wafer or through one or more ground contact pad (not shown). Voltage is applied to $V_{CONTROL}$ contact pad 15 and the output of waveform generator 10 is monitored through calibration contact pad 18. In the present embodiment an oscilloscope or other monitoring device (e.g., a computer having a test program) is connected to calibration contact pad 18 and a calibration process is performed by adjusting the voltage applied to $V_{CONTROL}$ contact pad 15 until the desired pulse frequency is obtained (e.g., waveform 42 shown in FIG. 4).

When voltage is applied to $V_{DD}$ and $V_{CONTROL}$ contact pads 14-15, waveform generator 10 generates pulses that are applied to each device under test 21-24 to be tested. More particularly, input through contact pads 26-27 turns on one of transistors 31-34, sending the output of waveform generator 10 to the particular transistor 21-24 that was selected by decoder 25. In one embodiment an address is received over address lines a0 and a1 via contact pads 26-27 that indicates which NMOS transistor 31-34 to be turned on. This address is received by decoder 25 which then applies a voltage to the selected NMOS transistor 31-34. A voltage $V_{SD}$ is applied to $V_{SD}$ contact pad 17 so as to apply a bias to each device under test 21-24. Waveform generator 10 pulses the substrate between inversion and accumulation and the resulting charge pumping current ($I_{CP}$) caused by the repetitive recombination at the interface traps is measured at $V_{SUB}$ contact pad 16. This process is repeated at different substrate bias levels to obtain additional measurements, providing the maximum charge pumping current $I_{CP, max}$ for the device 21-24 being tested. This process is repeated for each device under test 21-24, providing a maximum charge pumping current $I_{CP, max}$ for each device under test 21-24.

Following is an example in which each of transistors 21-24 are tested. First, NMOS transistor 31 is turned on so as to connect the gate of device under test 21 with waveform generator 10, pulsing NMOS transistor 21 between inversion and accumulation. The charge pumping current ($I_{CP}$) that is produced is measured at $V_{SUB}$ contact pad 16 for each substrate bias level to be tested, providing the maximum charge pumping current $I_{CP, max}$ for device under test 21. NMOS transistor 32 is then turned on to connect the gate of device under test 22 with waveform generator 10, pulsing NMOS transistor 22 between inversion and accumulation. The charge pumping current ($I_{CP}$) that is produced is measured at $V_{SUB}$ for each substrate bias level to be tested, providing the maximum charge pumping current $I_{CP, max}$ for device under test 22. This process is repeated for device under test 23 and device under test 24, providing the maximum charge pumping current $I_{CP, max}$ for device under test 33 and for device under test 24.

Figure 7:
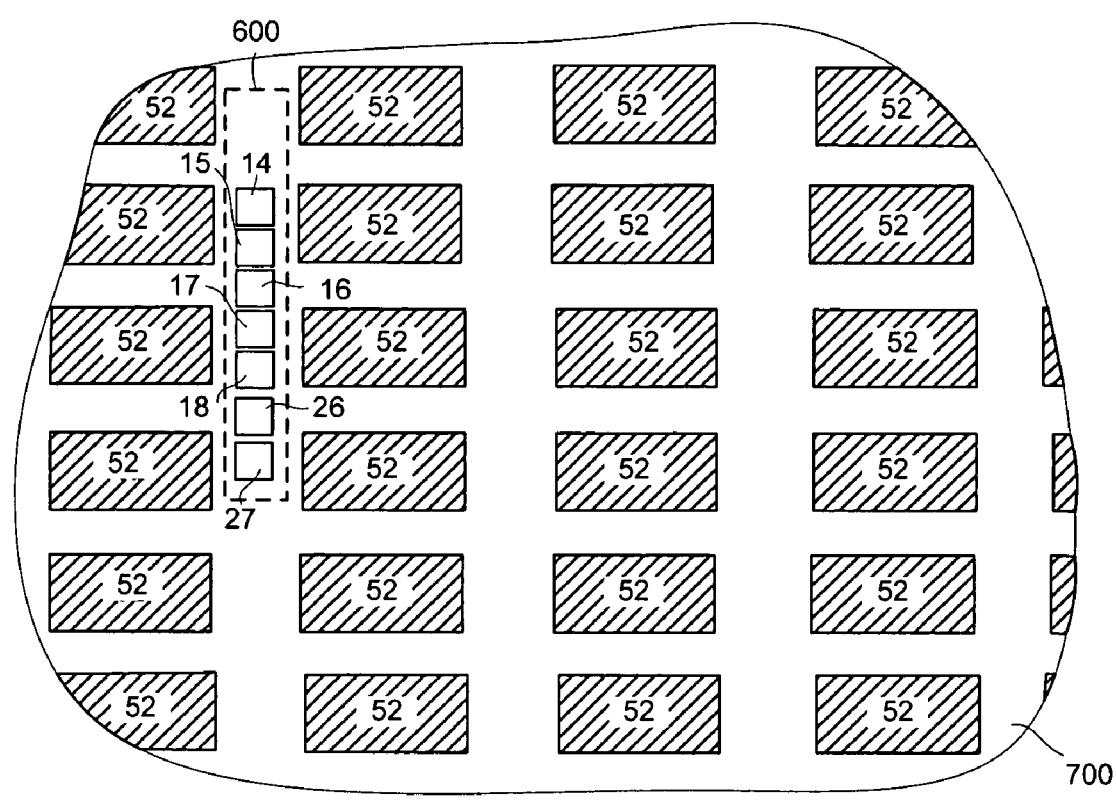
FIG. 7 is a diagram that illustrates a top view of a portion of a semiconductor substrate on which die regions have been formed and on which the test circuit of FIG. 6 has been formed in accordance with one embodiment of the present invention.
Figure 8:
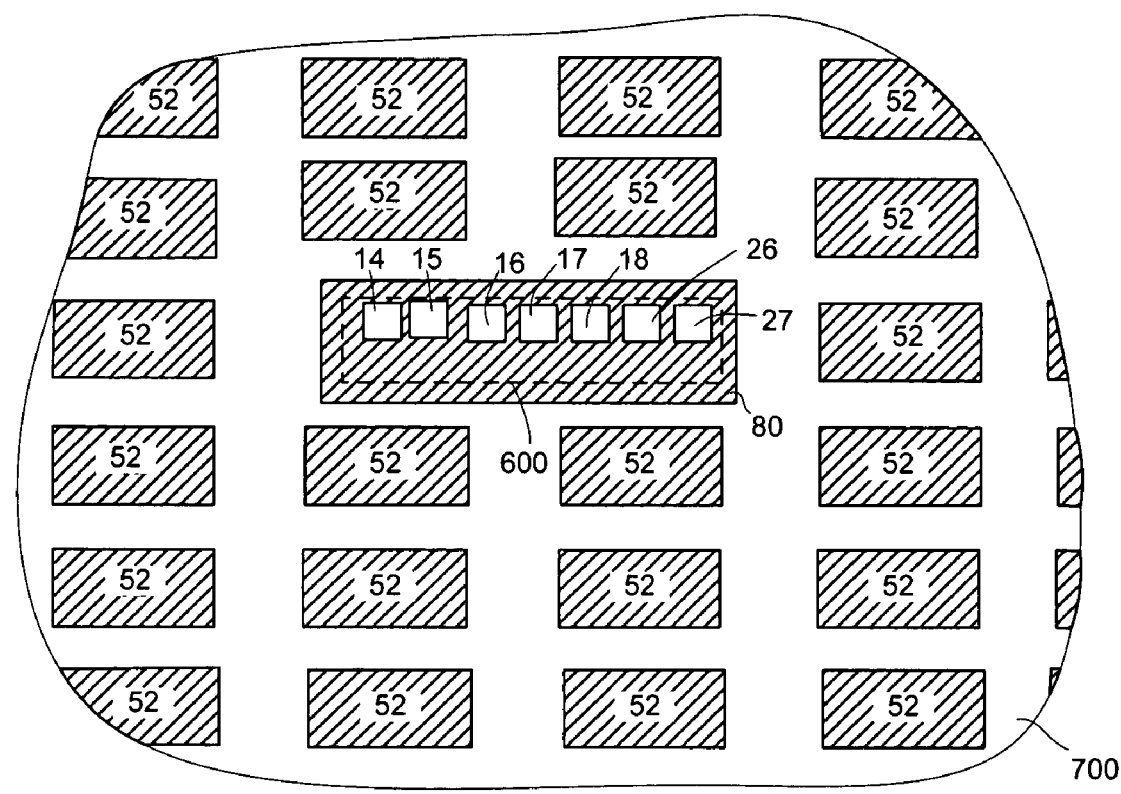
FIG. 8 is a diagram that illustrates a top view of a portion of a semiconductor substrate on which die regions have been formed and on which a test die has been formed that includes the test circuit of FIG. 6 in accordance with one embodiment of the present invention.

In the embodiment shown in FIG. 7 test circuit 600 is shown to be formed on a single semiconductor wafer 700 that is to be tested. In the present embodiment all of test circuit 600 is formed in a scribe line on semiconductor wafer 700, with contact pads 14-18 and 26-27 exposed so as to allow for testing of semiconductor wafer 700. Though the embodiment shown in FIG. 7 shows test circuit 600 to be formed in the scribe lines between die 52. Alternatively, test circuit 600 could be formed in a dedicated test die 80 as shown in FIG. 8.

Test circuit 600 is formed at the same time as die 52, using some or all of the process steps that are used to form surrounding die 52. In the present embodiment, each device under test 21-24 is a type of device that is formed in surrounding die 52 such that the charge pumping current, the maximum charge pumping current and the density of interface traps of each device under test 21-24 indicates the 1/f noise characteristics of a corresponding device in die 52.

The testing methods illustrated in FIGS. 6-7 and test circuit 600 allow for different types of devices to be tested using the same test circuit 600, without the need to probe multiple different test circuits as is required in the embodiment shown in FIG. 1. In addition, there is no need to perform multiple calibrations since a single calibration can be used for testing all of devices under test 21-24 in test circuit 600.

Figure 9:
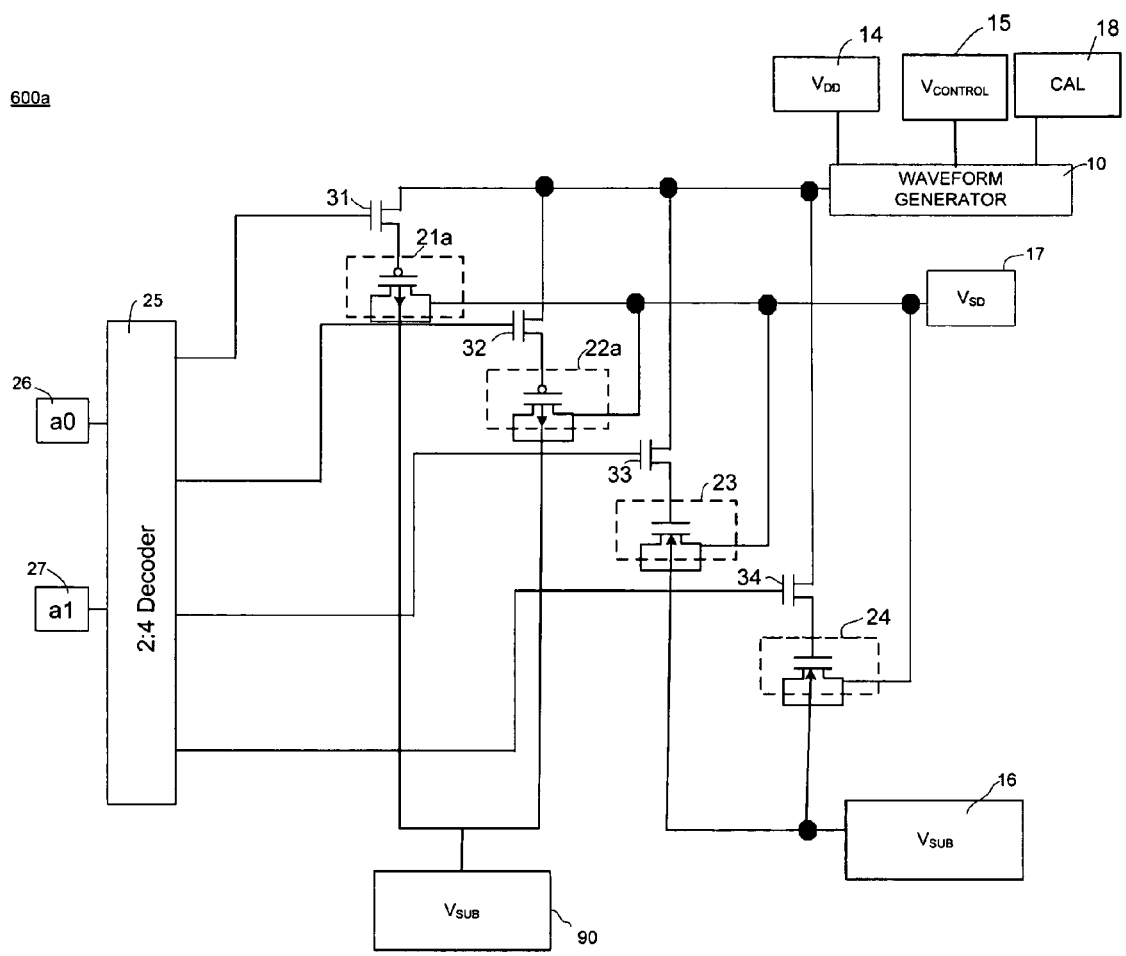
FIG. 9 is a diagram of a testing circuit that includes a waveform generator, a decoder and four transistors to be tested, where two of the transistors to be tested are P-channel transistors and two of the transistors to be tested are N-channel transistors, in accordance with one embodiment of the present invention.

Though test circuit 600 is shown to include four devices under test 21-24, it is appreciated that test circuit 600 can include more or fewer devices under test. In addition, though the devices under test 21-24 are shown as being NMOS transistors test circuit 600 can also test PMOS transistors and can test a combination of NMOS transistors and PMOS transistors. In the embodiment shown in FIG. 9, both NMOS and PMOS devices are tested. More particularly, a test circuit 600a is shown that includes PMOS devices 21a and 22a, and NMOS devices 23-24. In this embodiment the body of each NMOS device 23-24 is electrically connected to $V_{SUB}$ contact pad 16. The body of each PMOS device 21a and 22a are electrically connected to a $V_{SUB}$ contact pad 90. More particularly, in the present embodiment $V_{SUB}$ contact pad 90 is electrically coupled to the N-well of each PMOS device 21a and 22a. In operation, when NMOS devices 23 and 24 are tested $I_{CP}$ is measured at $V_{SUB}$ contact pad 16. Similarly, when PMOS devices 21a and 22a are tested $I_{CP}$ is measured at $V_{SUB}$ contact pad 90.

The test circuits of the present invention allow for testing numerous different types of devices using a limited number of contact pads. Accordingly, more devices on each semiconductor wafer can be tested while using only a limited amount of surface area on the semiconductor wafer. In addition, by including a waveform generator on the semiconductor wafer there is no need to attach the semiconductor wafer to a standalone waveform generator, saving setup time and the cost of purchasing a stand-alone waveform generator. Accordingly, the methods and apparatus of the present invention allow for testing devices on a semiconductor wafer without the need to connect the semiconductor wafer to a waveform generator. Moreover, the methods and apparatus of the present invention allow for testing numerous different types of devices, saving setup time and testing time.

The preferred embodiment of the present invention is thus described. While the present invention has been described in particular embodiments, it should be appreciated that the present invention should not be construed as limited by such embodiments, but rather construed according to the following claims.

What is claimed is:

1. A test circuit comprising:
   a waveform generator formed within scribe lines that extend between a die or within a test die of a semiconductor wafer, the waveform generator formed during a semiconductor process that forms the die on the semiconductor wafer;
   a transistor to be tested formed within scribe lines that extend between a die or within a test die of the semiconductor wafer, the transistor to be tested formed during a semiconductor process that forms the die on the semiconductor wafer, the transistor to be tested including a gate that is electrically coupled to the waveform generator, and including a source and a drain that are electrically coupled together;
   a first contact pad electrically coupled to the source and the drain of the transistor to be tested for providing a bias voltage to the transistor to be tested, the first contact pad formed within scribe lines that extend between a die or within a test die of said semiconductor wafer, the first contact pad formed during a semiconductor process that forms the die on the semiconductor wafer; and
   a second contact pad electrically coupled to the body of the transistor to be tested, the second contact pad formed within scribe lines that extend between a die or within a test die of the semiconductor wafer, the second contact pad formed during a semiconductor process that forms the die on the semiconductor wafer.

2. The test circuit of claim 1 further comprising a third contact pad that is electrically coupled to the waveform generator for monitoring the output of the waveform generator, the third contact pad formed within scribe lines that extend between a die or within a test die of the semiconductor wafer, the third contact pad formed during a semiconductor process that forms the die on the semiconductor wafer.

3. The test circuit of claim 2 further comprising a fourth contact pad and a fifth contact pad that are electrically coupled to the waveform generator, the fourth contact pad for coupling voltage to the waveform generator and the fifth contact pad for controlling the frequency of pulses generated by the waveform generator, the fourth contact pad and the fifth contact pad formed within scribe lines that extend between a die or within a test die of the semiconductor wafer, the fourth contact pad and the fifth contact pad formed during a semiconductor process that forms the die on the semiconductor wafer.

4. The test circuit of claim 3 wherein the waveform generator further comprises a multivibrator type oscillator and a Schmitt trigger, the output of the oscillator electrically coupled to the input of the Schmitt trigger.

5. A test circuit comprising:
   a waveform generator formed on a semiconductor wafer, the waveform generator formed within scribe lines that extend between a die or within a test die of the semiconductor wafer, the waveform generator formed during a semiconductor process that forms the die on the semiconductor wafer;
   a plurality of transistors to be tested on the semiconductor wafer, each of the transistors to be tested including a source and a drain that are electrically coupled together and that are electrically coupled to a first contact pad, the plurality of transistors to be tested and the first contact pad formed within scribe lines that extend between a die or within a test die of the semiconductor wafer, the plurality of transistors to be tested and the first contact pad formed during a semiconductor process that forms the die on the semiconductor wafer; and
   a switching circuit disposed on the semiconductor wafer, the switching circuit coupled to the waveform generator and operable to selectively couple the waveform generator to the transistors to be tested, the switching circuit formed within scribe lines that extend between a die or within a test die of the semiconductor wafer, the switching circuit formed during a semiconductor process that forms the die on the semiconductor wafer.

6. The test circuit of claim 5 further comprising a second contact pad for coupling output from the test circuit, the second contact pad electrically coupled to the body of the transistor to be tested, the second contact pad formed within scribe lines that extend between a die or within a test die of the semiconductor wafer, the second contact pad formed during a semiconductor process that forms the die on the semiconductor wafer.

7. The test circuit of claim 5 wherein the transistors to be tested comprise PMOS transistors.

8. The test circuit of claim 5 wherein the transistors to be tested comprise both NMOS transistors and PMOS transistors.

9. A testing method comprising:
applying a supply voltage to a waveform generator such that the waveform generator produces pulses that are applied to a gate of a transistor to be tested, the waveform generator and the transistor to be tested formed within scribe lines that extend between a die or within a test die of a semiconductor wafer, the waveform generator and the transistor to be tested formed during a semiconductor process that forms the die on the semiconductor wafer;
applying a voltage to a drain and to a source of the transistor to be tested, the drain and the source of the transistor to be tested electrically coupled together; and measuring the current that is generated at the body of the transistor to be tested.

10. A testing method as recited in claim 9 wherein the applying a voltage to the drain and to the source of the transistor to be tested further comprises applying a voltage to a first contact pad that is electrically coupled to the source and the drain of the transistor to be tested, the first contact pad formed within scribe lines that extend between a die or within a test die of the semiconductor wafer, the first contact pad formed during a semiconductor process that forms the die on the semiconductor wafer.

11. A testing method as recited in claim 10 wherein the measuring the current that is generated at the substrate of the semiconductor wafer further comprises measuring the current at a second contact pad that is electrically coupled to the substrate of the semiconductor wafer near the transistor to be tested, the second contact pad formed within scribe lines that extend between a die or within a test die of the semiconductor wafer, the second contact pad formed during a semiconductor process that forms the die on the semiconductor wafer.

12. A testing method as recited in claim 11 wherein the applying a supply voltage to a waveform generator further comprises applying a supply voltage to a fourth contact pad that is electrically coupled to the waveform generator, the fourth contact pad formed within scribe lines that extend between a die or within a test die of the semiconductor wafer, the fourth contact pad formed during a semiconductor process that forms the die on the semiconductor wafer, said method further comprising:
calibrating the waveform generator by applying a voltage to a fifth contact pad that is electrically coupled to the waveform generator while monitoring a sixth contact pad that is electrically coupled to the output of the waveform generator, the fifth contact pad formed within scribe lines that extend between a die or within a test die of the semiconductor wafer, the fifth contact pad formed during a semiconductor process that forms the die on the semiconductor wafer.

13. A testing method as recited in claim 9 wherein the applying a supply voltage to a waveform generator applies aid the pulses to gates of additional transistors to be tested that are formed on the semiconductor substrate, the additional transistors formed within scribe lines that extend between a die or within a test die of the semiconductor wafer, the additional transistors formed during a semiconductor process that forms the die on the semiconductor wafer, the method further comprising:
receiving input at a switching circuit, the switching circuit operable upon receiving the input to selectively couple the waveform generator to the gate of the transistor to be tested or to a gate of one of the additional transistors to be tested, the switching circuit formed within scribe lines that extend between a die or within a test die of the semiconductor wafer, the switching circuit formed during a semiconductor process that forms the die on the semiconductor wafer.

14. An apparatus for measuring charge pumping current comprising:
means for generating a waveform that includes pulses, the means for generating a waveform formed within scribe lines that extend between a die or within a test die of a semiconductor wafer, the means for generating a waveform formed during a semiconductor process that forms the die on the semiconductor wafer;
means for coupling the waveform to a gate of a transistor to be tested, the means for coupling the waveform to a gate of a transistor to be tested and the transistor to be tested formed within scribe lines that extend between a die or within a test die of the semiconductor wafer, the transistor to be tested formed during a semiconductor process that forms the die on the semiconductor wafer;
voltage means for applying a bias voltage to a source and a drain of the transistor to be tested, the source and the drain electrically coupled such that the waveform pulses a substrate of the semiconductor wafer between inversion and accumulation so as to generate a charge pumping current at the substrate; and
connection means for electrically coupling an external device to the body of said transistor to be tested for measuring the charge pumping current.

15. The apparatus of claim 14 wherein the means for coupling the waveform to a gate of a transistor to be tested and the transistor to be tested are formed on the semiconductor wafer during a semiconductor manufacturing process, the connection means including a contact pad that is electrically coupled to the substrate proximate the transistor to be tested, the contact pad formed within scribe lines that extend between a die or within a test die of the semiconductor wafer, the contact means formed during a semiconductor process that forms the die on the semiconductor wafer.

16. The apparatus of claim 15 wherein the means for generating a waveform comprises a waveform generator that is electrically coupled to the transistor to be tested, the means for coupling the waveform to a gate of a transistor to be tested including a switching circuit that is electrically coupled to the waveform generator, to the transistor to be tested and to a plurality of other transistors to be tested, the switching circuit and the plurality of other transistors formed within scribe lines that extend between a die or within a test die of a semiconductor wafer, the switching circuit and the plurality of other transistors formed during a semiconductor process that forms the die on the semiconductor wafer.

* * * * *

UNITED STATES PATENT AND TRADEMARK OFFICE
CERTIFICATE OF CORRECTION

| | |
|---|---|
| PATENT NO. | : 7,472,322 B1 |
| APPLICATION NO. | : 11/141223 |
| DATED | : December 30, 2008 |
| INVENTOR(S) | : Ma et al. |

It is certified that error appears in the above-identified patent and that said Letters Patent is hereby corrected as shown below:

Col. 9, line 61;
Claim 13, line 2, delete the word "aid".

Signed and Sealed this

Twenty-eighth Day of July, 2009

JOHN DOLL
*Acting Director of the United States Patent and Trademark Office*